(12) United States Patent
Iucolano (10) Patent No.: US 12,062,715 B2
(45) Date of Patent: Aug. 13, 2024

(54) HEMT TRANSISTOR WITH ADJUSTED GATE-SOURCE DISTANCE, AND MANUFACTURING METHOD THEREOF

(71) Applicant: STMICROELECTRONICS S.R.L., Agrate Brianza (IT)

(72) Inventor: Ferdinando Iucolano, Gravina di Catania (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 134 days.

(21) Appl. No.: 17/703,779

(22) Filed: Mar. 24, 2022

(65) Prior Publication Data
US 2022/0216333 A1    Jul. 7, 2022

Related U.S. Application Data

(62) Division of application No. 16/688,974, filed on Nov. 19, 2019, now Pat. No. 11,316,038.

(30) Foreign Application Priority Data

Nov. 20, 2018   (IT) .................. 102018000010448

(51) Int. Cl.
*H01L 29/66* (2006.01)
*H01L 29/40* (2006.01)
(Continued)

(52) U.S. Cl.
CPC ........ *H01L 29/7786* (2013.01); *H01L 29/401* (2013.01); *H01L 29/402* (2013.01);
(Continued)

(58) Field of Classification Search
None
See application file for complete search history.

(56) References Cited

U.S. PATENT DOCUMENTS 6,274,893 B1    8/2001  Igarashi et al.
6,521,961 B1    2/2003  Costa et al.
(Continued)

FOREIGN PATENT DOCUMENTS

CN    101299437 A    11/2008
CN    101414625 A    4/2009
(Continued)

OTHER PUBLICATIONS

Bisi et al., "Kinetics of Buffer-Related R-Increase in GaN-on-Silicon MIS-HEMTs," *IEEE Electron Device Letters* 35(10): 1004-1006, 2014.
(Continued)

*Primary Examiner* — Grant S Withers
(74) *Attorney, Agent, or Firm* — Seed IP Law Group LLP (57) ABSTRACT

An HEMT includes: a heterostructure; a dielectric layer on the heterostructure; a gate electrode, which extends throughout the thickness of the dielectric layer; a source electrode; and a drain electrode. The dielectric layer extends between the gate electrode and the drain electrode and is absent between the gate electrode and the source electrode. In this way, the distance between the gate electrode and the source electrode can be designed in the absence of constraints due to a field plate that extends towards the source electrode.

19 Claims, 5 Drawing Sheets

(51) Int. Cl.
  *H01L 29/778* (2006.01)
  *H01L 29/78* (2006.01)
(52) U.S. Cl.
  CPC .... *H01L 29/66462* (2013.01); *H01L 29/7787* (2013.01); *H01L 29/7838* (2013.01)

(56) References Cited

U.S. PATENT DOCUMENTS

| | | | |
|---|---|---|---|
| 9,419,121 | B1 | 8/2016 | Teo et al. |
| 9,647,103 | B2* | 5/2017 | Koudymov ........... H01L 29/402 |
| 10,381,470 | B2 | 8/2019 | Iucolano et al. |
| 2003/0020092 | A1 | 1/2003 | Parikh et al. |
| 2007/0045670 | A1* | 3/2007 | Kuraguchi ............. H01L 29/78 257/E29.253 |
| 2007/0249119 | A1 | 10/2007 | Saito |
| 2007/0278518 | A1 | 12/2007 | Chen et al. |
| 2009/0267078 | A1 | 10/2009 | Mishra et al. |
| 2011/0303952 | A1* | 12/2011 | Hwang ............... H01L 29/1029 257/E21.403 |
| 2014/0159116 | A1 | 6/2014 | Briere et al. |
| 2014/0284613 | A1 | 9/2014 | Kuraguchi et al. |
| 2014/0353720 | A1 | 12/2014 | Inoue et al. |
| 2015/0076562 | A1* | 3/2015 | Yasui ................ H01L 29/41766 257/194 |
| 2015/0270355 | A1 | 9/2015 | Kuraguchi et al. |
| 2015/0270379 | A1 | 9/2015 | Kuraguchi et al. |
| 2016/0035871 | A1 | 2/2016 | Simin et al. |
| 2016/0056145 | A1* | 2/2016 | Nagumo ............. H01L 27/0255 257/76 |
| 2017/0077277 | A1 | 3/2017 | Saito et al. |
| 2017/0077284 | A1 | 3/2017 | Ono et al. |
| 2017/0092752 | A1 | 3/2017 | Lu et al. |
| 2017/0345922 | A1 | 11/2017 | Iucolano et al. |

FOREIGN PATENT DOCUMENTS

| | | |
|---|---|---|
| CN | 102130158 A | 7/2011 |
| CN | 102629624 A | 8/2012 |
| CN | 102637726 A | 8/2012 |
| CN | 102683406 A | 9/2012 |
| CN | 106298905 A | 1/2017 |
| CN | 206412367 U | 8/2017 |
| JP | 2001127282 A | 5/2001 |
| JP | 2009267155 A | 11/2009 |
| WO | WO 2018191096 A1 | 10/2018 |

OTHER PUBLICATIONS

Chevtchenko et al., "Off-state breakdown and dispersion optimization in AlGaN/GaN heterojunction field-effect transistors utilizing carbon doped buffer," *Applied Physics Letters* 100:223502, 3 pages, 2012.

Hilt et al., "Normally-off GaN Transistors for Power Application," *Journal of Physics: Conference Series* 494:012001, 6 pages, 2014.

Hwang et al., "Impact of Channel Hot Electrons on Current Collapse in AlGaN/GaN HEMT's," *IEEE Electron Device Letters* 31(12): 1494-1496, 2013.

Jin et al., "Total current collapse in High-Voltage GaN MIS-HEMTs induced by Zener Trapping," IEEE, Microsystems Technology Laboratories, Massachusetts Institute of Technology, pp. 6.2.1-6.2.4, 2013.

Lin, "Market and Technology Trends in WBG Materials for Power Electronics Applications," CS Mantech Conference, May 18-21, 2015, Scottsdale, Arizona, USA pp. 33-36.

Moens et al., "On the Impact of Carbon-Doping on the Dynamic Ron and Off-state Leakage Current of 650V GaN Power Devices" 2015 IEEE 27th International Symposium on Power Semiconductor Devices & IC's (ISPSD), 2015, 4 pages.

Würfl et al., "Techniques towards GaN power transistors with improved high voltage dynamic switching properties," IEDM13-1147 pp. 6.1.1-6.1.4, 2013.

Dora, Y. et al., "High Breakdown Voltage Achieved on AlGaN/GaN HEMT With Integrated Slant Field Plates," *IEEE Electron Device Letters*, vol. 27, No. 9, Sep. 2006, 3 pages.

Chu, R. et al., "V-Gate GaN HEMTs for X-Band Power Applications," *IEEE Electron Device Letters*, vol. 29, No. 9, Sep. 2008, 3 pages.

Roccaforte, F., "Epitaxial NiO gate dielectric on AlGaN/GaN heterostructures," *Applied Physics Letters* 100, 063511, 2012, 4 pages.

Dechun, G. "A simulation about the influence of the Gate-Source-Drain distance on the AlGaN/GaN HEMT performance at Ka-band " 2012 IEEE MTT-S Int. Micro. Work. Ser. on Milli. Wave Wire. Tech, and App. Published online Oct. 25, 2012 pp. 1-4 (Year: 2012).

Kolluri, S. "Rf Performance of Deep-Recessed N-Polar GaN MIS-HEMTs using a selective Etch Technology Without Ex Situ Surface Passivation" IEEE Elec. Dev. Lett. vol.32, No. 2, Feb. 2011 pp. 134-136 (Year: 2011).

Wong, K-Y "Integrated Voltage Reference and Comparator Circuits for GaN Smart Power Chip Technology" 2009 21st Int. Symp. on Pow. Semi. Dev. & ICs Jul. 7, 2009 pp. 57-60 (Year: 2009).

\* cited by examiner

HEMT TRANSISTOR WITH ADJUSTED GATE-SOURCE DISTANCE, AND MANUFACTURING METHOD THEREOF

BACKGROUND

Technical Field

The present disclosure relates to a high-electron-mobility transistor (HEMT) (and to the manufacturing method thereof. In particular, the present disclosure regards a HEMT transistor with adjusted gate-source distance.

Description of the Related Art

Transistors are known, which are based upon the formation of layers of two-dimensional electron gas (2DEG) with high mobility at a heterojunction, i.e., at the interface between semiconductor materials with different band gaps. For instance, HEMT transistors are known based upon the heterojunction between a layer of aluminum gallium nitride (AlGaN) and a layer of gallium nitride (GaN).

HEMT transistors based upon AlGaN/GaN heterojunctions afford a wide range of advantages that render them particularly suited and widely used for various applications. For instance, the high breakdown threshold of HEMT transistors is exploited for high-performance power switches. The high mobility of the electrons in the conductive channel makes it possible to provide high-frequency amplifiers. Moreover, the high concentration of electrons in the 2DEG enables a low ON-state resistance ($R_{ON}$) to be obtained.

On account of the high cost of gallium-nitride substrates, HEMT transistors based upon AlGaN/GaN heterojunctions are normally obtained via growth of GaN and AlGaN layers on silicon substrates. Consequently, the HEMT transistors thus obtained are of a planar type; i.e., they have the source, gate, and drain electrodes or terminals aligned in a plane parallel to the substrate.

A known solution for providing HEMT transistors consists in the use of recessed-gate terminals.

Figure 1:
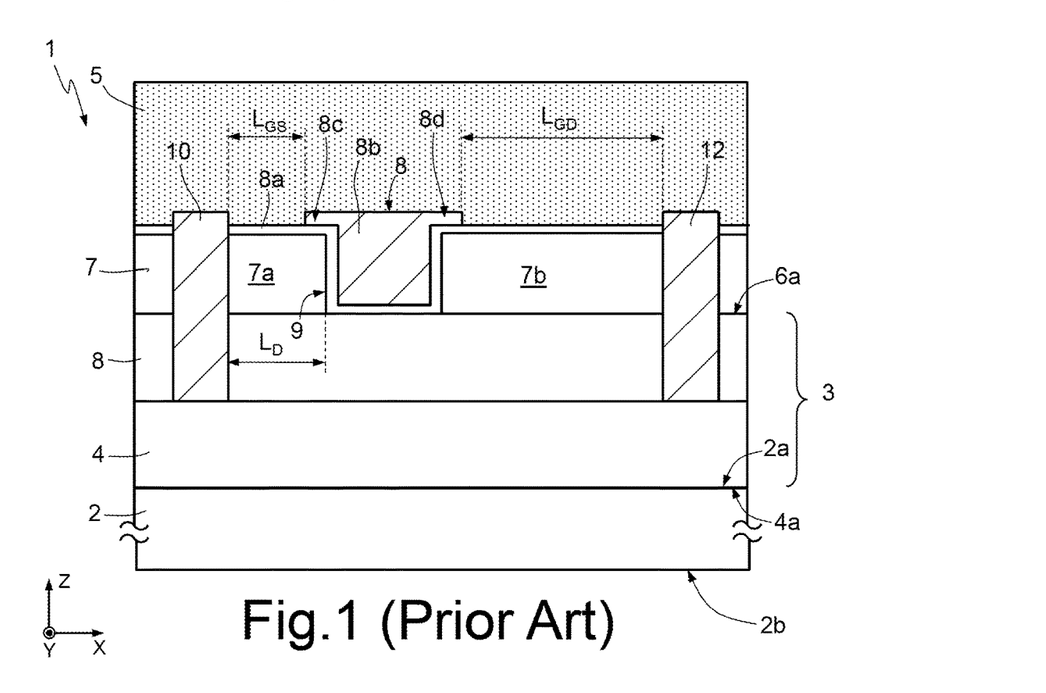
FIG. 1 is a side section view of a HEMT transistor according to an embodiment of a known type.

A transistor of this type is illustrated schematically in FIG. 1.

FIG. 1 shows, in a triaxial system of mutually orthogonal axes X, Y, Z, a HEMT device 1, which includes: a substrate 2, made, for example, of silicon; a channel layer 4 of intrinsic gallium nitride (GaN), which extends over the substrate 2; a barrier layer 6 of intrinsic aluminum gallium nitride (AlGaN), which extends over the channel layer 4; an insulation layer 7 of dielectric material, such as nickel oxide (NiO), which extends on an upper side 6a of the barrier layer 6; and a gate region 8, which extends in the insulation layer 7 between a source terminal 10 and a drain terminal 12.

The channel layer 4 and the barrier layer 6 form a heterostructure 3.

In a way not illustrated in the figure, a buffer layer may be present between the substrate 2 and the heterostructure 3.

A gate terminal 8, of a recessed type, extends in depth through the insulation layer 7, until it reaches the barrier layer 6. In other words, the gate terminal 8 is formed in a trench 9 etched through the insulation layer 7. The source terminal 10 and the drain terminal 12, which are made of conductive material, for example metal material, extend in depth in the semiconductor body 5, completely through the barrier layer 6, terminating at the interface between the barrier layer 6 and the channel layer 4. The channel layer 4 and the barrier layer 6 are, in general, made of materials such that, when they are coupled together as illustrated in FIG. 1, they form a heterojunction that enables formation of a region, or layer, of two-dimensional gas (2DEG).

A gate dielectric layer 8a extends in the trench 9, facing the bottom and side walls of the trench 9. A gate metallization 8b completes filling of the trench 9 and extends over the gate dielectric layer 8a. The gate dielectric layer 8a and the gate metallization 8b form the gate terminal 8 of the HEMT device 1.

The gate terminal 8 is separated laterally (i.e., along X) from the source terminal 10 and drain terminal 12 by means of respective portions 7a and 7b of the insulation layer 7. As illustrated in FIG. 1, as a consequence of the manufacturing process currently used, the gate metallization 8b likewise extends over the insulation layer 7, alongside the trench 9, forming in particular a field-plate element 8c that extends along X towards the source terminal 10. A similar field-plate element 8d extends along X in the opposite direction, i.e., towards the drain terminal 12.

A passivation layer 5, for example made of insulating or dielectric material, in particular silicon nitride ($Si_3N_4$), extends over the source terminal 10, the drain terminal 12, and the gate terminal 8, and over the insulation layer 7. The passivation layer 5 has the function of protection of the source terminal 10, the drain terminal 12, and the gate terminal 8 from external agents.

The field-plate gate topology is an efficient technique used for reducing the high electrical field in the region between the gate terminal and the drain terminal. The field-plate gate topology implies a design of the HEMT device 1 such that the side of the gate terminal 8 facing the drain terminal 12 extends over the insulation layer 7 to form the field-plate element 8d, so as to reduce the electrical field in the region between the gate terminal 8 and the drain terminal 12 and thus raise the breakdown threshold of the HEMT device 1.

In current manufacturing processes, formation of the field-plate element 8d, oriented towards the drain terminal 12, is obtained simultaneously with formation of the field-plate element 8c, oriented towards the source terminal 10.

The present applicant has found that, even though AlGaN/GaN structures form a 2DEG layer with low electrical resistance thanks to the high current density and electron mobility, the distance LD between the gate terminal 8 and the source terminal 10 is a parameter that significantly affects the value of the current density supplied at output from the HEMT device 1, the value of ON-state resistance $R_{ON}$, and the peak value of the transconductance, in particular for radiofrequency (RF) applications and low-voltage power applications.

In particular, the aforementioned parameters improve by approaching the gate terminal 8 to the source terminal 10, i.e., reducing the distance $L_D$ between the gate terminal 8 and the source terminal 10, measured along the axis X at the top surface 6a of the channel layer 6.

However, a reduction of the distance LD causes an undesired approach of the field-plate element 8c to the source terminal 10. This aspect is undesired in so far as it increases the risk of short-circuits between the gate terminal 8 and the source terminal 10 and likewise increases the value of capacitance $C_{GS}$ between the gate terminal 8 and the source terminal 10.

Moreover, it should be noted that the RF gain, $RF_{gain}$, is proportional to the ratio between the cut-off frequency Ft and the value of frequency f ($RF_{gain} \approx F_t/f$), where Ft is proportional to the inverse of the capacitance $C_{GS}$ between the gate terminal 8 and the source terminal 10 ($F_t \approx 1/C_{GS}$). Consequently, to maximize the RF gain, it is expedient to reduce the value of the capacitance $C_{GS}$, or, in other words, to move the field-plate element 8c away from the source terminal 10. Moreover, it may be noted that also the capacitance that is formed between the field-plate element 8c and the underlying heterostructure 3 has a negative impact on the RF gain.

BRIEF SUMMARY

One or more embodiments of the present disclosure provide a HEMT, and a manufacturing method thereof, that take into due consideration the contrasting drawbacks set forth previously.

Hence, according to the present disclosure a HEMT transistor and a method for manufacturing the transistor are provided.

BRIEF DESCRIPTION OF THE SEVERAL VIEWS OF THE DRAWINGS

Figure 2A:
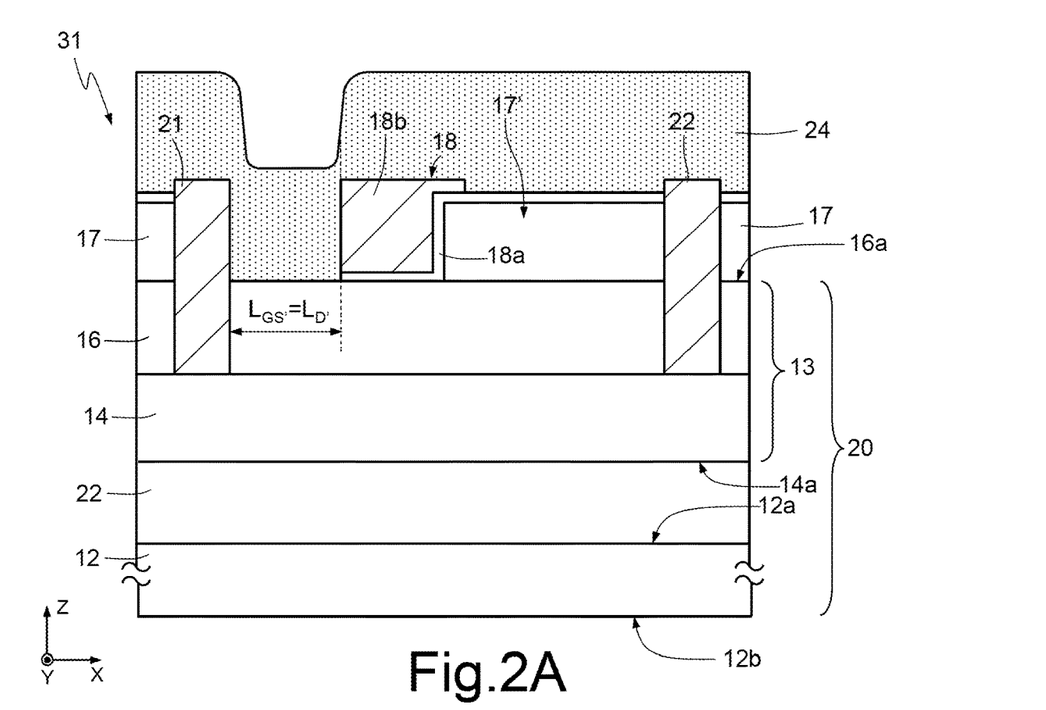
FIG. 2A is a side section view of a HEMT transistor according to an embodiment of the present disclosure.

For a better understanding of the present disclosure, preferred embodiments thereof are now described, purely by way of non-limiting example, with reference to the attached drawings, wherein:

FIG. 2A shows a HEMT device 31, in a triaxial system of mutually orthogonal axes X, Y, Z. The present disclosure applies indifferently to a HEMT device of a normally-off type or of a normally-on type.

DETAILED DESCRIPTION

An HEMT device 31 includes a substrate 12, made, for example, of silicon, or silicon carbide (SiC), or sapphire ($Al_2O_3$); an (optional) buffer layer 22, which extends on the substrate 12; a channel layer 14 made of intrinsic gallium nitride (GaN), which extends on the buffer layer 22 (or directly on the substrate 12 in the case where the buffer layer 22 is not present), and has a thickness comprised between approximately 1 μm and 5 μm; a barrier layer 16, made of intrinsic aluminum gallium nitride (AlGaN) or, more in general, of compounds based upon ternary or quaternary alloys of gallium nitride, such as $Al_xGa_{1-x}N$, AlInGaN, $In_xGa_{1-x}N$, and $Al_xIn_{1-x}Al$, which extends on the channel layer 14 and has a thickness $t_b$ comprised between approximately 5 nm and 30 nm; an insulation layer 17, made of dielectric material, such as nickel oxide (NiO), which extends on an upper side 16a of the barrier layer 16; and a gate terminal 18, which extends in the insulation layer 7 between a source terminal 21 and a drain terminal 22.

The channel layer 14 and the barrier layer 16 form a heterostructure 13. The substrate 12, the buffer layer 22 (when present), the channel layer 14, and the barrier layer 16 are hereinafter referred to, as a whole, as "semiconductor body 20". The heterostructure 13 hence extends between an underside 14a of the channel layer 14, which constitutes part of the interface with the underlying substrate 12, and an upper side 16a of the barrier layer 16. The channel layer 14 and the barrier layer 16 are, in general, made of materials such that, when coupled together, as illustrated in FIG. 2A, form a heterojunction that enables formation of a region, or layer, of two-dimensional gas (2DEG).

The gate terminal 18, which comprises a gate dielectric 18a and a gate metallization 18b, extends throughout the thickness of the insulation layer 17, until it reaches the barrier layer 16. Optionally, according to a different embodiment (not illustrated), the gate terminal 18 extends through a part of the barrier layer 16 and terminates within the barrier layer 16. The gate dielectric layer 18a electrically insulates the gate metallization 18b from the barrier layer 16.

The source region 21 and the drain region 22, which are made of conductive material, for example metal, extend in depth in the semiconductor body 20, right through the barrier layer 16, terminating at the interface between the barrier layer 16 and the channel layer 14.

The 2DEG region extends at the interface between the channel layer 14 and the barrier layer 16 underneath the insulation layer 17, i.e., in interface portions between the channel layer 14 and the barrier layer 16 corresponding to the projection along Z of the insulation layer 17. According to further embodiments, the semiconductor body 20 may comprise just one or more than one layer of GaN, or GaN alloys, appropriately doped or of an intrinsic type.

According to an aspect of the present disclosure, the gate terminal 18 is separated laterally (i.e., along X) from the drain terminal 22 by means of a portion 17' of the insulation layer 17. A respective portion of the insulation layer 17 is not, instead, present between the gate terminal 18 and the source terminal 21. In this way, during the manufacturing steps, as illustrated more fully hereinafter, there is no formation of a field-plate element, of the type designated by the reference 8c in FIG. 1, which protrudes towards the source terminal 21.

A minimum distance $L_{GS}'$ between the gate terminal 18 and the source terminal 21, measured along X, is equal to a distance $L_D'$ between the gate terminal 18 and the source terminal 21 measured at the surface 16a of the barrier layer 16. Given the absence of the field-plate element between the gate terminal 18 and the source terminal 21, the distance between the gate terminal 18 and the source terminal 21 remains constant throughout the extension, along Z, of the side surface 25 of the gate terminal 18 that faces the source terminal 21. In other words, this side surface 25 extends, or lies, in the plane YZ and has, in each point considered, the same distance $L_D$ from the source terminal 21. The distance $L_D$ is measured, in each point considered of the side surface, in a direction parallel to the axis X, which is orthogonal to the plane YZ. It is evident that the distance $L_D$ is considered constant even in the presence of non-idealities deriving from the manufacturing process, for example corrugations, depressions, or protuberances present on the side surface 25 of the gate terminal 18 and/or on the facing surface of the source terminal 21.

According to the present disclosure, the distance between the gate terminal 18 and the source terminal 21 is chosen, in the design step, so as to improve at the same time the value of ON-state resistance $R_{ON}$ and the peak value of the transconductance, and to maximize the RF gain.

In fact, as compared to the embodiment of a known type represented in FIG. 1, the present disclosure makes it possible to approach the gate terminal 18 to the source terminal 21 with a reduction of the risk of shorting (owing to the absence of the corresponding field-plate element) and at the same time to maximize the RF gain when the contribution of capacitance between the field-plate element facing the source terminal and the underlying heterostructure is eliminated.

Moreover, the side extension, along X, of the HEMT device 31 can be reduced, for example by a value equal to the extension along X of the field-plate element 8c, which is now no longer present.

In other words, according to the present disclosure, by eliminating the field-plate element exclusively in the spatial region between the gate terminal and the source terminal, it is possible to obtain a HEMT transistor configured to meet as well as possible specific needs of application, reducing the design constraints.

A passivation layer 24, made, for example, of insulating or dielectric material such as $Si_3N_4$, $SiO_2$, $Al_2O_3$, or AlN, extends on the source terminal 21, the drain terminal 22, and the gate terminal 18, and in particular between the gate terminal 18 and the source terminal 21. The passivation layer 24 extends between the gate terminal 18 and the source terminal 21 until it reaches and physically contacts the channel layer 16.

The passivation layer 24 has the function of protection of the source terminal 21, the drain terminal 22, and the gate terminal 18 from external agents and likewise has the function of side electrical insulation between the gate terminal 18 and the source terminal 21.

Figure 2B:
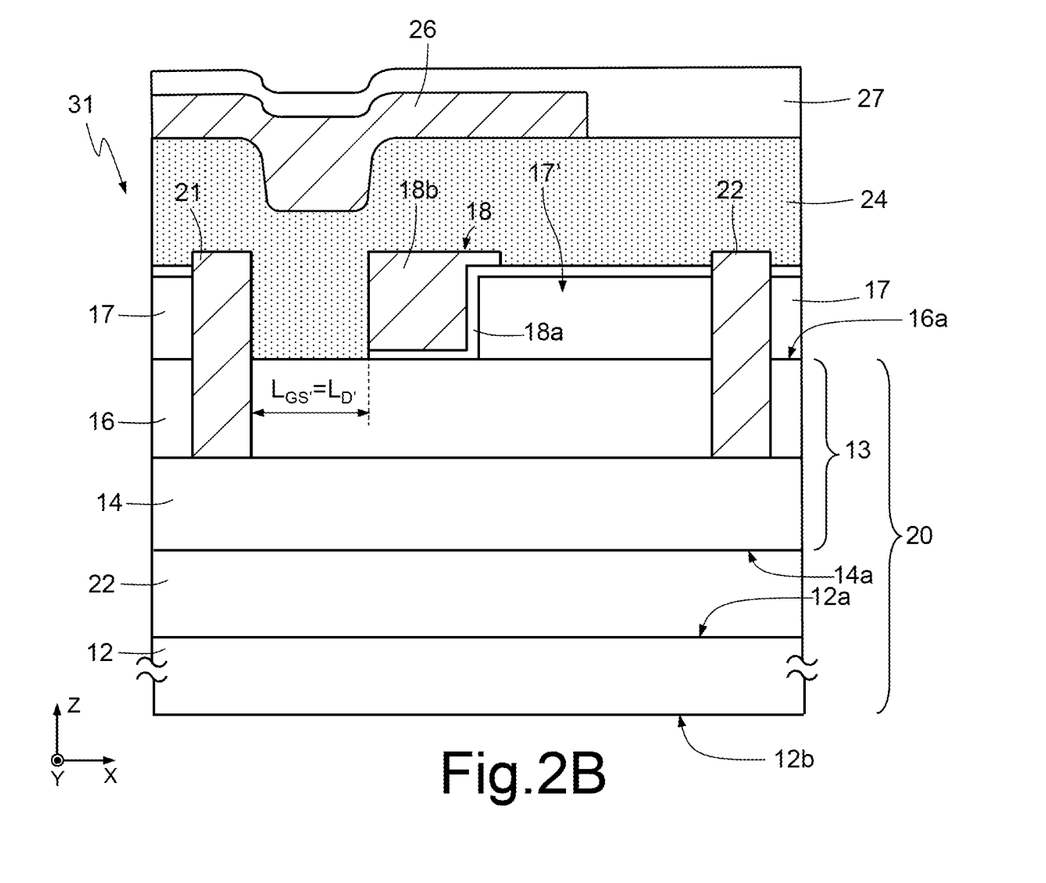
FIG. 2B is a side section view of a HEMT transistor according to a further embodiment of the present disclosure.

According to another embodiment, a further field-plate metal layer 26, illustrated in FIG. 2B, extends over the passivation layer 24, in particular on the gate terminal 18 and likewise alongside the latter. To provide protection and insulation of the above further field-plate metal layer 26, a dielectric layer 27, for example made of $SiO_2$, is, in this case, present. The remaining elements of FIG. 2B correspond to the ones already illustrated in FIG. 2A and described with reference to FIG. 2A. They are not hence described any further, and they are identified by the same reference numbers.

Figure 3A:
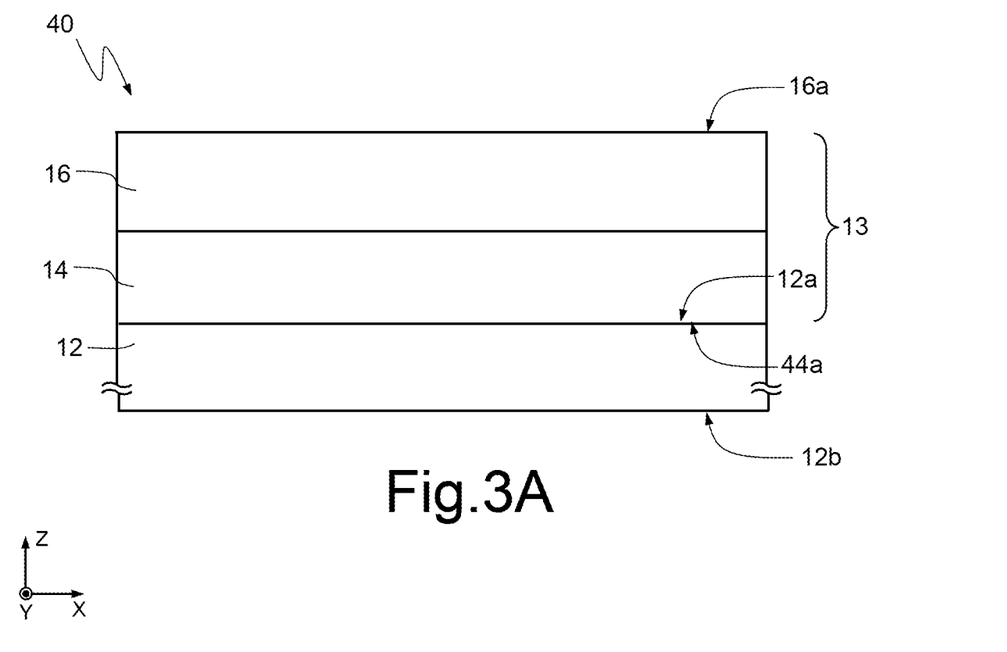
FIGS. 3A-3F show steps for manufacturing the HEMT transistor of FIG. 2A.
Figure 3B:
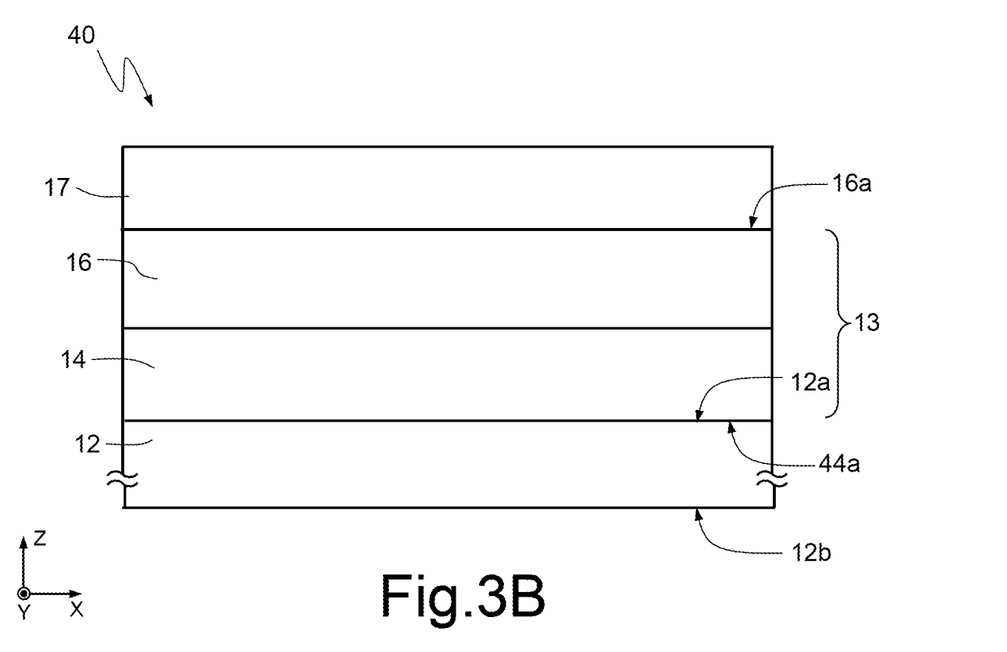
Figure 3C:
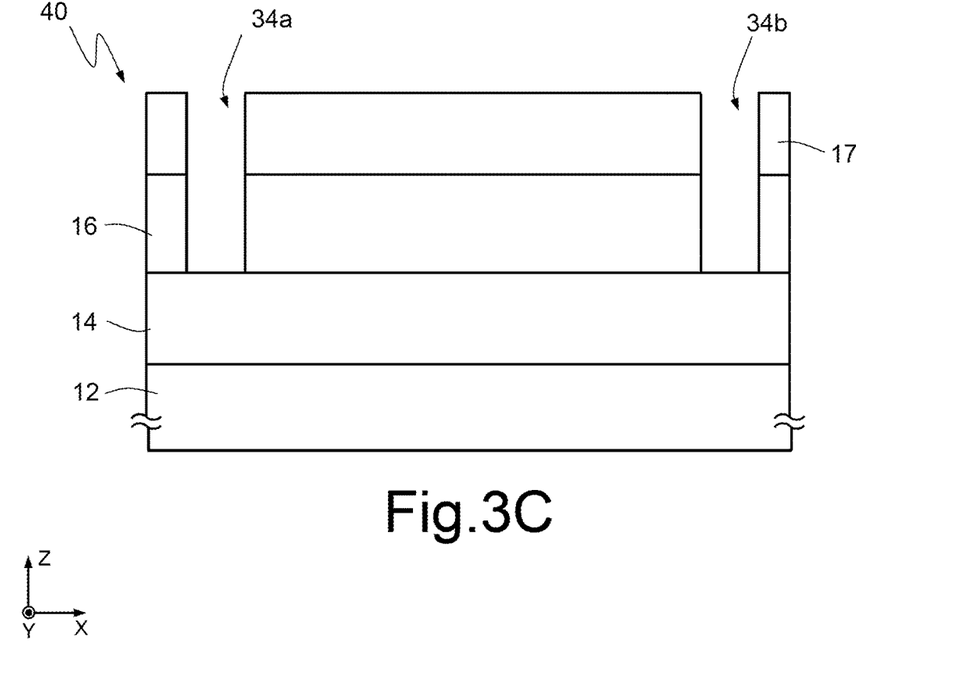

Illustrated in what follows, with reference to FIGS. 3A-3F, are steps for manufacturing the HEMT device 1. FIG. 3A shows, in cross-sectional view, a portion of a wafer 40 during a step for manufacturing the HEMT device 31, according to an embodiment of the present disclosure. Elements of the wafer 40 common to the ones already described above with reference to FIG. 2, and illustrated in FIG. 2, are designated by the same reference numbers. In particular (FIG. 3A), the wafer 40 is provided, comprising: the substrate 12, made, for example, of silicon (Si) or silicon carbide (SiC) or aluminum oxide ($Al_2O_3$), having a front side 12a and a back side 12b opposite to one another in a direction Z; the channel layer 14, made of gallium nitride (GaN), having its own underside 14a that extends adjacent to and overlapping the front side 12a of the substrate 12; and the barrier layer 16, made of aluminum gallium nitride (AlGaN), which extends over the channel layer 14. The barrier layer 16 and the channel layer 14 form the hetero structure 13.

Next (FIG. 3B), formed on a front side 16a of the barrier layer 16 is the insulation layer 17, made of dielectric material such as silicon oxide ($SiO_2$) and having a thickness comprised between 10 nm and 150 nm. The insulation layer 17 may also be made of nickel oxide (NiO), or silicon nitride ($Si_3N_4$), or aluminum oxide ($Al_2O_3$), or aluminum nitride (AlN). Formation of the insulation layer 17 is performed via epitaxial growth on the barrier layer 6 (AlGaN). With reference to Roccaforte, F. et al., "Epitaxial NiO gate dielectric on AlGaN/GaN heterostructures," Appl. Phys. Lett., vol. 100, 063511, 2012, it is known that it is possible to carry out an epitaxial growth of NiO on AlGaN by means of MOCVD (Metal Organic Chemical Vapor Deposition).

Then (FIG. 3C), a step of masked etching of the insulation layer 17 is carried out to remove selective portions of the latter that extend in regions of the wafer 40 in which it is desired to form the source region 21 and the drain region 22 of the HEMT device 1. Etching proceeds, possibly with a different etching chemistry, for removing exposed portions of the barrier layer 16, until the channel layer 14 is reached. In particular, openings 34a and 34b are formed.

Then (FIG. 3D), a step of formation of ohmic contacts is carried out to obtain the source and drain regions 21, 22 by depositing conductive material, in particular a metal, such as titanium (Ti), tantalum (Ta), aluminum (Al), or alloys or compounds thereof, by means of sputtering or vapor deposition, within the openings 34a, 34b.

Figure 3D:
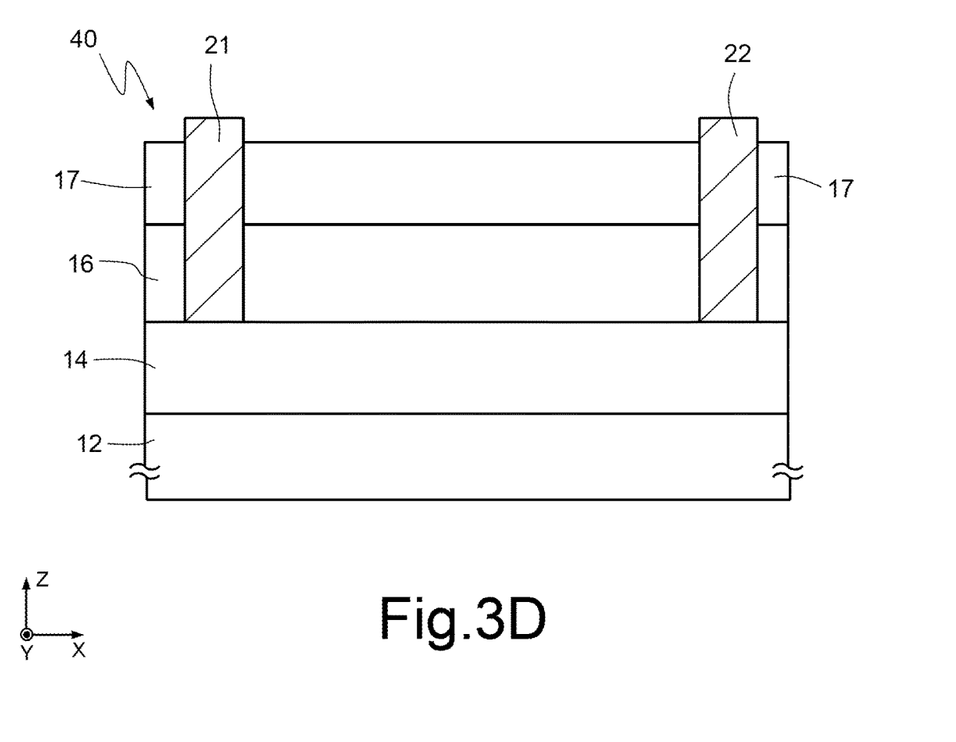

This is followed by a step of rapid thermal annealing (RTA), for example at a temperature of between approximately 500° C. and 700° C. for a time of from 30 s to 120 s, which makes it possible to perfect formation of the ohmic contacts of the source region 21 and the drain region 22 with the underlying region (presenting the 2DEG).

Then (FIG. 3E), the insulation layer 17 is selectively removed, for example by means of lithographic and etching steps so as to remove selective portions thereof in a region of the wafer 40 in which, in subsequent steps, the gate region 18 of the HEMT device 31 is to be formed.

Figure 3E:
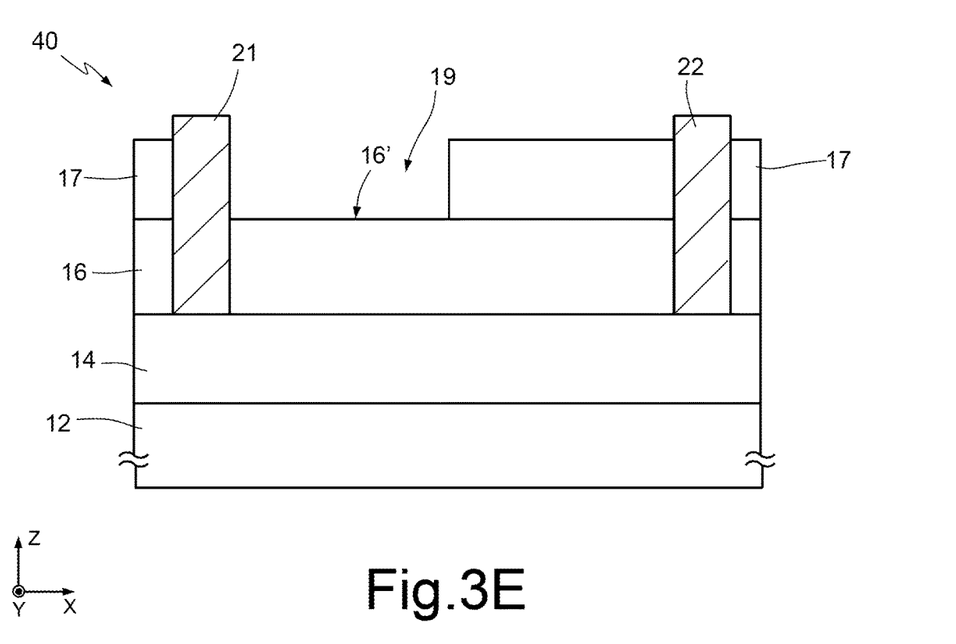

The etching step can stop at the underlying barrier layer 16 (as illustrated in FIG. 3E), or else proceed partially within the barrier layer 16 or, again, completely involve the barrier layer 16 (in a way not illustrated in the figures).

A surface portion 16' of the barrier layer 16 is thus exposed. Etching of the barrier layer 16 is, for example, of a dry type. The portion of the barrier layer 16 removed generates a trench 19, which extends throughout the thickness of the insulation layer 17.

As described with reference to FIG. 2A, the step of FIG. 3E envisages etching of the insulation layer 17 in a region that extends from the source terminal 21 towards the drain terminal 22 (without reaching the latter), with removal of the insulation layer 17 alongside the source terminal 21.

Then (FIG. 3F), formed, for instance by deposition, is the gate dielectric layer 18a, made for example of a material chosen from among aluminum nitride (AlN), silicon nitride (SiN), aluminum oxide ($Al_2O_3$), and silicon oxide ($SiO_2$). The gate dielectric layer 18a has a thickness chosen between 5 nm and 50 nm, for example 30 nm.

Figure 3F:
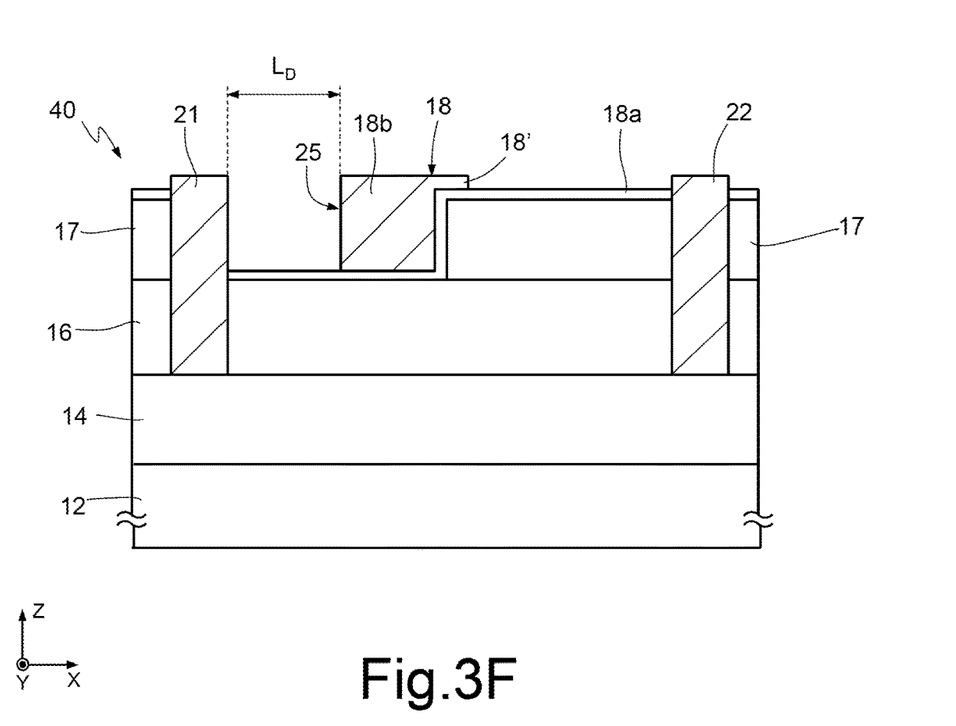

Then, a step of deposition of conductive material on the wafer 40 is carried out to form, by means of known photolithographic techniques, the gate metallization 18b on the gate dielectric layer 18a, filling the trench 19 and thus forming the gate region 18. For instance, the gate metallization 18b is made of metal material, such as tantalum (Ta), tantalum nitride (TaN), titanium nitride (TiN), palladium (Pa), tungsten (W), tungsten silicide ($WSi_2$), titanium aluminum (Ti/Al), and nickel gold (Ni/Au).

The gate dielectric layer 18a that is not protected by the gate metallization 18b (and in particular the portion of the gate dielectric 18a that extends, in top plan view in the plane XY, between the gate metallization 18b and the source terminal 21), can be removed by means of an etching step or kept on the wafer 40, indifferently.

Formation of the gate terminal 18 does not damage the source and drain terminals already formed. In fact, even though some of the metals of the source and drain terminals (typically, Ti and Ta) could be partially etched, the effect thereon is not important for operation of the device; the aluminum is not damaged, nor partially etched, by the chemistry used for etching the gate dielectric 18a.

The gate terminal 18 is formed, as mentioned previously with reference to FIG. 2A, so as to provide the gate metallization 18b at a distance $L_D$ from the source terminal 21. Just one field-plate element 18' extends as a continuation of the gate metallization 18b towards the drain terminal 22, on the insulation layer 17. No similar field-plate element is instead present extending towards the source terminal 21 in so far as, in the spatial region between the gate terminal 18 and the source terminal 21, the insulation layer 17 is absent.

Finally, a step of deposition of the passivation layer 24 is carried out. This step is performed, for example, by depositing a layer of 400 nm by means of PECVD.

The material of the passivation layer 24 is deposited within the space present between the gate terminal 18 and the source terminal 21, filling it and electrically insulating the gate terminal 18 from the source terminal 21.

The HEMT device 31 illustrated in FIG. 2A is thus formed.

The advantages of the disclosure according to the present disclosure emerge clearly from what has been set forth previously.

In particular, there may be noted, according to the present disclosure, a reduction in the $R_{ON}$ (due to a shorter gate-source distance), and hence an increase in the maximum current supplied at output from the device and also in the output power.

Moreover, there may be noted a reduction in the gate-to-source capacitance $C_{GS}$ and hence an increase in the cut-off frequency and gain, in particular in RF applications.

Finally, it is clear that modifications and variations may be made to what has been described and illustrated herein, without thereby departing from the sphere of protection of the present disclosure.

For instance, the metallization of the (source, drain, and gate) contacts on the front of the wafer can be performed using any variant known in the literature, such as formation of contacts made of AlSiCu/Ti or Al/Ti, or W-plugs, or others still.

Moreover, the channel layer 4 and the barrier layer 6 may be made of other materials chosen from among compound materials constituted by elements of Groups III and V, such as InGaN/GaN or AlN/GaN.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   manufacturing a high electron mobility transistor (HEMT), the manufacturing including:
   forming a heterostructure;
   forming a dielectric layer on the heterostructure;
   forming a source electrode and a drain electrode extending through the dielectric layer and electrically contacting the heterostructure; and
   forming a gate electrode, between the source electrode and the drain electrode, wherein forming the gate electrode comprises:
   forming a trench, after forming the source electrode, the trench having a first side that is the source electrode and a second side spaced from the first side, the trench being throughout an entire thickness of the dielectric layer forming a gate dielectric layer in the trench; and
   forming a gate metallization on the gate dielectric layer by depositing conductive material at the second side of the trench-, the gate metallization having a side surface in the trench, the side surface being spaced from the second side of the trench, the side surface facing the first side of the trench that is the source electrode, the side surface being at a distance from the source electrode that is constant throughout an extension of the gate metallization, the side surface is coplanar with a surface of the gate dielectric layer in the trench.

2. The method according to claim 1, wherein the distance is taken along a first direction orthogonal to a plane defined by the side surface of the gate metallization.

3. The method according to claim 2, wherein forming the gate metallization includes shaping the conductive material by etching the conductive material along a second direction orthogonal to the first direction.

4. The method according to claim 1, further comprising forming a passivation layer that completely fills the trench between the gate electrode and the source electrode and extends over the gate electrode, the source electrode, and the drain electrode.

5. A method, comprising:
   manufacturing a high electron mobility transistor (HEMT), the manufacturing including:
   forming a heterostructure;
   forming a dielectric layer on the heterostructure;
   forming a source electrode and a drain electrode extending through the dielectric layer and electrically contacting the heterostructure; and
   forming a gate electrode, between the source electrode and the drain electrode, wherein forming the gate electrode comprises:
   forming a trench, having a first side and a second side, throughout an entire thickness of the dielectric layer by removing selective portions of the dielectric layer adjacent to the source electrode, the side surface is coplanar with a surface of the gate dielectric layer in the trench; forming a gate dielectric in the trench; and
   forming a gate metallization having a first surface by depositing conductive material in the trench on the gate dielectric and on the second side and shaping the conductive material, the first surface facing the source electrode, which extends at a distance from the source electrode that is constant throughout an extension of the gate metallization extension of the gate metallization, the first surface being coplanar with a second surface of the gate dielectric in the trench.

6. The method according to claim 5, further comprises forming, a field-plate element that extends over the dielectric layer.

7. A method, comprising:
   forming a high electron mobility transistor by:
   forming a heterostructure;
   forming a first dielectric layer on the heterostructure;
   forming an opening in the first dielectric layer that exposes a first surface of the heterostructure, the first surface of the heterostructure having a first portion and a second portion adjacent to the first portion;
   forming a second dielectric layer on the first dielectric layer and in the opening on the first portion of the first surface of the heterostructure, the second dielectric layer partially exposing the second portion of the first surface of the heterostructure, the second dielectric layer having a side surface in the opening between the first and second portions of the first surface of the heterostructure, the side surface of the second dielectric layer being transverse to the first surface of the heterostructure;

forming a first electrode and a second electrode, which extend into, and in electrical contact with, the heterostructure; and forming a gate electrode on the first portion of the first surface of the heterostructure, the gate electrode extending between the first electrode and the second electrode, the gate electrode including a side surface in the opening and facing the first electrode, the side surface extending at a distance from the first electrode, an entirety of the second portion of the first surface of the heterostructure being between the first electrode and the gate electrode, the side surface of the second dielectric layer facing the first electrode, the side surface of the second dielectric layer substantially coplanar with the side surface of the gate electrode.

8. The method according to claim 7, wherein the distance is taken along a first direction orthogonal to a plane defined by the side surface of the gate electrode.

9. The method according to claim 7, comprising:
forming a passivation layer that extends between the gate electrode and the first electrode throughout an entire extension of the side surface of the gate electrode, and over the gate electrode, the first electrode, and the second electrode, the passivation layer having a trench between the first electrode and the gate electrode.

10. The method according to claim 9, wherein forming the passivation layer includes: extending the passivation layer to a barrier layer of the heterostructure having a channel layer and the barrier layer on the channel layer.

11. The method according to claim 7, wherein forming the second dielectric layer includes: extending the second dielectric layer between the gate electrode and the second electrode.

12. The method according to claim 7, comprising:
forming a field-plate element, which extends as a prolongation of the gate electrode towards the second electrode.

13. The method according to claim 7, comprising:
forming a passivation layer that extends between the gate electrode and the first electrode throughout an entire extension of the side surface, and over the gate electrode, the first electrode, and the second electrode, the passivation layer contacting the second portion of the first surface of the heterostructure; and forming a field-plate metal layer extending on the passivation layer and above the gate and first electrodes, the passivation layer electrically insulating the field-plate metal layer from the gate and first electrodes.

14. A method, comprising:
forming a heterostructure having a first layer and a second layer having a first surface, the first layer on the first surface of the second layer;

forming a first insulation layer on the first layer;

forming a first electrode that extends through the first insulation layer and the first layer and is in contact with the first surface of the second layer of the heterostructure;

forming a second electrode that extends through the first insulation layer and the first layer and is in contact with the first surface of the second layer of the heterostructure;

forming an opening in the first insulation layer between the first electrode and the second electrode, a second surface of the first layer being exposed by the opening, the second surface of the first layer being opposite of the first surface of the second layer, wherein a side of the first electrode is exposed by the opening;

forming a second insulation layer on the second surface of the first layer in the opening and on the first insulation layer;

forming at least a portion of a gate electrode in the; and opening exposing at least a portion of the second surface of the first layer in the opening by removing a portion of the second insulation layer in the opening.

15. The method of claim 14, comprising:
forming a passivation layer in the opening, in contact with a third surface of the second insulation layer, between the gate electrode and the first electrode, the third surface of the second insulation layer being opposite of the second surface of the first layer the third surface of the second insulation layer being coplanar with a side surface of the gate electrode;

forming the passivation layer on the first electrode, the second electrode, and the second insulation layer.

16. The method of claim 15, wherein forming the passivation layer in the opening between the gate electrode and the first electrode includes: forming the passivation layer to directly contact with a side surface of the first electrode that faces the gate electrode in the opening.

17. The method of claim 15, wherein a top surface of the passivation layer is higher between the gate electrode and the second electrode than between the gate electrode and the first electrode.

18. The method of claim 17, wherein the top surface of the passivation layer between the gate electrode and the first electrode is higher than a top surface of the gate electrode.

19. The method according to claim 14, wherein a side surface of the gate electrode extends at a distance from the first electrode that is constant throughout an entire extension of the side surface of the gate electrode.

* * * * *

UNITED STATES PATENT AND TRADEMARK OFFICE
CERTIFICATE OF CORRECTION

| | |
|---|---|
| PATENT NO. | : 12,062,715 B2 |
| APPLICATION NO. | : 17/703779 |
| DATED | : August 13, 2024 |
| INVENTOR(S) | : Ferdinando Iucolano |

It is certified that error appears in the above-identified patent and that said Letters Patent is hereby corrected as shown below:

In the Claims

Column 8, Claim 1, Line 6:
"of the trench-, the" should read: --of the trench, the--.

Column 8, Claim 5, Lines 41-43:
"source electrode, the side surface is coplanar with a surface of the gate dielectric layer in the trench; forming a gate" should read: --source electrode, the removing selective portions of the dielectric layer including completely removing the dielectric layer between the source electrode and the second side of the trench; forming a gate--.

Column 10, Claim 14, Lines 25-26:
"in the; and opening exposing" should read: --in the opening; and exposing--.

Column 10, Claim 15, Line 34:
"first layer the third" should read: --first layer, the third--.

Column 10, Claim 15, Line 36:
"gate electrode;" should read: --gate electrode; and--.

Signed and Sealed this
Fifteenth Day of October, 2024

*Katherine Kelly Vidal*
Katherine Kelly Vidal
*Director of the United States Patent and Trademark Office*